United States Patent [19]

Jacques

[11] Patent Number: 4,851,613
[45] Date of Patent: Jul. 25, 1989

[54] FLEXIBLE CIRCUIT LAMINATE FOR SURFACE MOUNT DEVICES

[75] Inventor: Roland Jacques, Lowell, Mass.

[73] Assignee: Flex Technology, Inc., Hudson, N.H.

[21] Appl. No.: 204,113

[22] Filed: Jun. 8, 1988

[51] Int. Cl.$^4$ .............................................. H05K 1/00
[52] U.S. Cl. ................................. 174/68.5; 361/398
[58] Field of Search ...................... 361/397, 398, 400; 174/685

[56] References Cited

U.S. PATENT DOCUMENTS

| | | | |
|---|---|---|---|
| 3,383,564 | 5/1968 | Lalmond et al. | 361/398 |
| 3,546,775 | 12/1970 | Lalmond et al. | 361/398 |
| 3,936,575 | 2/1976 | Watanabe et al. | 428/418 X |
| 4,191,800 | 3/1980 | Holtzman | 174/68.5 |
| 4,335,272 | 6/1982 | Pittenger | 174/68.5 |
| 4,353,954 | 10/1982 | Yamaoka et al. | 174/685 X |
| 4,590,539 | 5/1986 | Sanjana et al. | 361/400 |
| 4,647,508 | 3/1987 | Gazit et al. | 428/421 |
| 4,677,252 | 6/1987 | Takahashi et al. | 174/68.5 |
| 4,728,751 | 3/1988 | Canestaro et al. | 174/68.5 |
| 4,742,183 | 5/1988 | Soloway et al. | 174/68.5 |
| 4,751,146 | 6/1988 | Maeda et al. | 428/475.8 |

OTHER PUBLICATIONS

Lee, T. S.; Wiltshire, B.; Culver, D.; *Joint Strength Analysis of Surface Mounted Components*. IP Technical Rev., Dec. 1985, pp. 14–19.
Reimann, W. G. Gates, L. E.; *Polyimide-Quartz Fabric Printed Circuit Boards for Mounting Leadless Chip Carriers*. IPC Tech. Rev. Mar. 1983, pp. 11–15.
Gilleo K., *Using SM Devices on Flexible Circuitry*, Electronics Mar, 1986, pp. 20–23.
Harper, C. A.; Staley W. W.; *Some Critical Material Factors in the Application of Leadless Chip Carrier Packages*. Elec. Pack, and Prod, Aug. 1981, pp. 134–142.
Mahler, B.; *Polyimide Quartz: A Chip Carrier Laminate Material, PCFAB, Apr. 1983, pp. 63–65.*
Patel, D.; Wiltshire B.; *The Role of Connectors in Surface Mount Technology*, IPC Technical Review, May 1985, pp. 10–13.
Corlam ® Laminates and Prepregs. Dupont Electronics.
Woodgage, R., *How to Wave Solder Discrete Chip Components*, Electronics, Jun. 1983, pp. 21–22.
Swift D. R., Comerford M. F., *Soldering Cleaning and Environmental Testing of Printed Wiring Assemblies that Contain Surface Mounted Devices*, IPC Technical Review, Mar./Apr. 1985, pp. 15–18.

*Primary Examiner*—Morris H. Nimmo
*Attorney, Agent, or Firm*—Lorusso & Loud

[57] ABSTRACT

The disclosed invention provides a flexible circuit board for use in surface mount technology. A polyaramid fiber reinforced resin provides a substrate for a copper cladding in which a circuit is formed. Overlaying the circuitry are a plurality of spaced insulating pads also reinforced with polyaramid fiber for dimensional stability. The spaces insulated pads define fold-lines along which the circuit may be folded, thereby providing a degree of flexibility required for flexible circuit applications.

8 Claims, 1 Drawing Sheet

FLEXIBLE CIRCUIT LAMINATE FOR SURFACE MOUNT DEVICES

BACKGROUND OF THE INVENTION

1. Field of the Invention

The present invention combines the field of surface mount technology with the field of flexible circuit technology.

2. The Prior Art

A flexible circuit is a multiplanar interconnection system having a flexibility which permits the circuit board to be bent, folded and/or rolled into a desired shape. Such flexibility eliminates many connectors, wires and cables which would otherwise be necessary in connection with the use of a corresponding hardboard or ceramic type circuit. Elimination of connections conventionally required for hardboard circuitry increases reliability, reduces costs, simplifies automation and increases circuit density and performance. While more expensive per unit area than hardboard, flexible circuitry achieves a savings when used as a replacement for two hardboard elements with connectors.

However, utilization of flexible circuit technology has been limited by problems with regard to dimensional stability and the integrity of adhesive bonds between adhering laminae, especially at high temperature.

In standard leaded circuit board connections, holes are drilled through the circuit board and the leads of the device to be mounted thereon, e.g. resistor, capacitor, IC's are inserted and soldered into the holes. The earliest "boards" for integrated circuits were ceramic. The difficulty of generating holes and achieving plating through those holes demanded a different type of mounting technology for such circuit boards. Surface mount technology offers a route around the problem of drilling and finishing holes for reception of component leads. Further, surface mount technology lends itself better to smaller component size, provides higher circuit density, especially in view of the fact that it permits both sides of the circuit board to be completely used. The major existent problem with surface mount technology resides in thermal expansion mismatches between the mounted devise and the substrate or circuit board on which the devise is mounted. Differentials in thermal expansion as between the device and the substrate result in solder joint cracking and the breaking of electrical and physical connections between the mounted component and the circuit board substrate.

SUMMARY OF THE INVENTION

It has now been discovered that the features and advantages of both surface mount technology and flexible circuit technology can be achieved in a unique design employing specific materials chosen for their dimensional stability. Specifically, the present invention provides a flexible circuit board for surface mount components including a substrate(s), a layer(s) of conductive material and an insulating layer(s). The substrate(s) is reinforced with a polyaramid, preferably a woven fabric of polyaramid fiber. The insulating layer(s) is formed by a plurality of rectangular insulating elements spaced apart along the length of the substrate with their longest dimension traverse to the longest dimension of the substrate. These rectangular insulating elements are spaced apart to define fold-lines. Each insulating element is, like the substrate, reinforced with a polyaramid fabric to provide dimensional stability.

Accordingly, it is an object of the present invention to provide a flex circuit board for the surface mounting of various surface mount devices such as resistors, capacitors and IC's composed of a unique combination of materials affording structural integrity at higher temperatures than heretofore obtainable.

It is a further object of the present invention to provide a design and material combination affording sufficient flexibility for use in conventional flexible circuit applications with a minimal difference in the coefficient of thermal expansion as between the circuit board and components conventionally mounted thereon.

The foregoing and other objects and further scope of applicability of the present invention will become apparent from the detailed description to follow, taken in conjunction with the accompanying drawings.

DESCRIPTION OF THE PREFERRED EMBODIMENTS

The present invention, as previously noted, provides a flexible circuit board well-suited for receiving surface mount components due to its high degree of dimensional stability which derives from the presence of polyaramid in both the substrate and the insulating layer. A polyaramid may be defined as a polyamide in which the intermediates are wholly aromatic. Because of their aromatic ring structure and their relatively regular molecular chain structure, they are high melting, high in thermal stability and high in dimensional stability.

In the preferred embodiments the polyaramid fiber, both that in the substrate and that in the insulating layer(s), is KEVLAR ®, the trademark of E.I. Dupont de Nemours & Co. for an aromatic polyamide containing para-oriented linkages. KEVLAR ® melts at over 500° C. and possesses a high degree of thermal and dimensional stability which make the material well-suited for use in the present invention.

In the preferred embodiments a COR-LAM ® element may be used for the combination of the substrate and conductive layer of the present invention. COR-LAM ® is the trademark of E. I. Dupont de Nemours for a copper-clad laminate. The substrate for the copper cladding is a laminate of an epoxy (e.g. Dow QUATREX ®) impregnated KEVLAR ® fabric. For the purposes of the present invention, the thinnest available element (2 mils/ply) is preferred from the viewpoint of flexibility.

Figure 1:
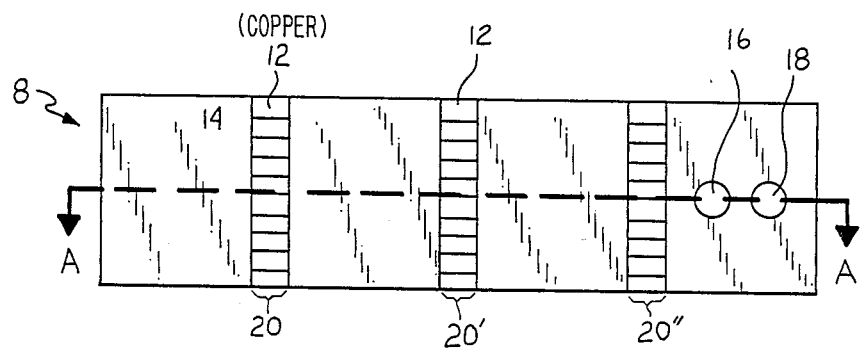
FIG. 1 is a plan view of a circuit board element in accordance with preferred embodiment of the present invention.
Figure 2:
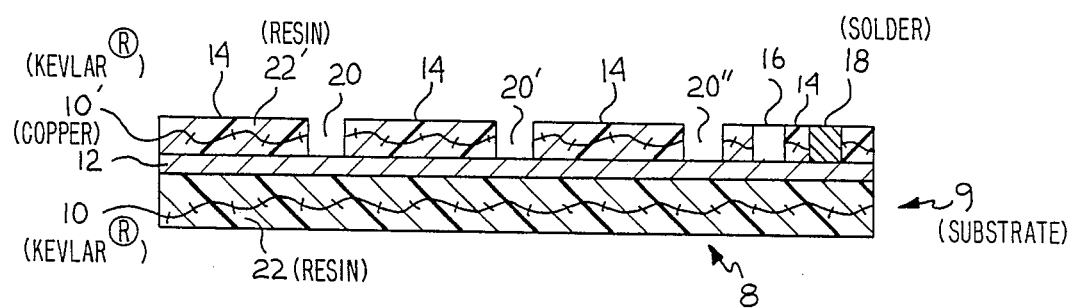
FIG. 2 is an elevational view, in cross-section, taken along line A—A in FIG. 1.
Figure 3:
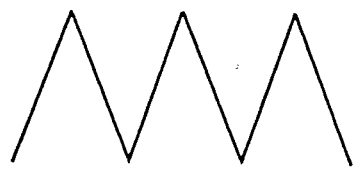
FIG. 3 is an schematic representation of a circuit board in accordance with the present invention folded into pleats.

FIGS. 1 and 2 show a preferred embodiment of the present invention. Generally indicated at 8 is a flexible circuit board ready for receiving circuit mount devices (CMD's). The circuit board 8 includes a substrate, generally indicated at 9. The substrate 9 includes a woven KEVLAR fabric 10 and an impregnating resin 22. Resin 22 may be, for example, an epoxy or polyester resin but, most preferred for its flexibility is an acrylic adhesive which cures to a non-tacky state. Such a suitable acrylic adhesive is LG-1000 or PYRALUX®, both marketed by E.I. DuPont. Shown on top of substrate 9 is a copper conductor 12. Adhered to the copper conductor pattern 12 are a number of spaced rectangular insulating elements 14. Insulating elements 14 are spaced to define fold-lines 20, 20' and 20" therebetween. The fold-lines 20, 20' and 20" allow the board to be folded accordian style as shown in FIG. 3 or otherwise folded or bent as required. Insulating elements 14 are, like the substrate 9, reinforced with a woven KEVLAR® fabric 10'. The resin 22' is epoxy, acrylic, etc. or, most preferably acrylic. At 16 is one window and at 18 is a window filled with solder.

EXAMPLE

A COR-LAM® 5010 element measuring 95×55 mm (2 mils/ply) was etched to obtain a desired circuit. Four insulating pads, in the form of rectangular elements of woven KEVLAR® fabric 55×17 mm (2 mil nominal thickness), had a number of "windows" cut out and were impregnated with an epoxy resin (QUATREX® 5010, tradename of Dow Chemical Co.) and spaced (2 mm spacing) along the etched copper clad surface of the COR-LAM® element. The epoxy in the insulating layer was then cured. Solder was then applied by (a Hot Air Leveling Machine) to form terminals for the surface mount elements and to complete the circuit.

The resultant product was as is depicted in FIGS. 1 and 2. The invention may be embodied in other specific forms without departing from its spirit or essential characteristics. The foregoing embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

I claim:

1. A flexible circuit board for surface mount components comprising:
    a dielectric substrate including a polyaramid layer;
    a layer of conductive material adhered to at least a portion of said substrate;
    an insulating layer adhered to said conductive layer, said insulating layer including:
    a plurality of insulating panels adhered to said conductive layer and spaced along one dimension of said circuit board to provide for fold-lines therebetween, said insulating panels each comprising a woven fabric of polyaramid fiber.

2. A flexible circuit board in accordance with claim 1 wherein said conductive material defines an electrical circuit.

3. A flexible circuit in accordance with claim 2 wherein windows are cut out of at least one of said insulating panels to allow surface mount devices to be soldered to said circuit through said windows.

4. A flexible circuit in accordance with claim 2 wherein said conductive material is copper.

5. A flexible circuit in accordance with claim 1 wherein said polyaramid layer is woven fabric of polyaramid fiber.

6. A flexible circuit in accordance with claim 5 wherein said woven fabric of said substrate and said woven fabric of said insulating panels are impregnated with a resin.

7. A flexible circuit in accordance with claim 5 wherein said resin is an acrylic resin.

8. A flexible circuit in accordance with claim 1 wherein said panels are approximately coextensive with said circuit board in the direction transverse to said one dimension.

* * * * *